US009735738B2

(12) United States Patent
Aksin

(10) Patent No.: US 9,735,738 B2
(45) Date of Patent: Aug. 15, 2017

(54) LOW-VOLTAGE LOW-POWER VARIABLE GAIN AMPLIFIER

(71) Applicant: ANALOG DEVICES GLOBAL, Hamilton (BM)

(72) Inventor: Devrim Aksin, Istanbul (TR)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/989,203

(22) Filed: Jan. 6, 2016

(65) Prior Publication Data

US 2017/0194911 A1    Jul. 6, 2017

(51) Int. Cl.
*H03F 3/45* (2006.01)
*H03F 1/02* (2006.01)
*H03G 3/30* (2006.01)

(52) U.S. Cl.
CPC ......... *H03F 1/0211* (2013.01); *H03F 3/4508* (2013.01); *H03G 3/30* (2013.01); *H03F 2203/45112* (2013.01)

(58) Field of Classification Search
CPC .............. H03F 3/45; H03F 2200/279; H03F 2200/282; H03F 2200/285
USPC .......................... 330/254, 252, 261; 327/359
See application file for complete search history.

(56) References Cited

U.S. PATENT DOCUMENTS

| 4,586,155 | A |   | 4/1986  | Gilbert                 |
| 4,694,204 | A | * | 9/1987  | Nishijima ...... G06G 7/163 |
|           |   |   |         |                 327/359 |
| 5,656,964 | A |   | 8/1997  | Liu                     |
| 5,877,974 | A |   | 3/1999  | Can                     |
| 5,986,501 | A |   | 11/1999 | Rafati et al.           |
| 6,084,460 | A |   | 7/2000  | Takeuchi                |
| 6,124,761 | A |   | 9/2000  | Robinson et al.         |
| 7,024,448 | B2|   | 4/2006  | Matsugaki et al.        |

OTHER PUBLICATIONS

Fong-Cheng Chang et al., *A Low Power Folded Mixer for UWB System Applications in 0.18-μm CMOS Technology*, IEEE Microwave and Wireless Components Letters, vol. 17, No. 5, May 2007, 1531-1309, © 2007 IEEE, 3 pages.

Nandini, A.S. et al., *Design and Implementation of Analog Multiplier with Improved Linearity*, International Journal of VLSI Design & Communication System (VLSICS), vol. 3, No. 5, Oct. 2012, DOI: 10-5121/vlsic.2012.3508, 17 pages.

(Continued)

*Primary Examiner* — Steven J Mottola
(74) *Attorney, Agent, or Firm* — Patent Capital Group

(57) ABSTRACT

In high speed communication applications, e.g., optical communication, a variable gain amplifier is used for input signal amplitude normalization or for linear equalization. Traditionally a bipolar Gilbert multiplier circuit is used. When moving towards a low-power application, a modified circuit topology is implemented to reduce the minimum supply voltage requirement of the variable gain amplifier while ensuring that bias current levels remain substantially the same and achieving the same current switching capacity as the traditional circuit. As a result, the power consumption of the circuit can be greatly reduced. The modified circuit topology combines the amplifier and gain transistors and achieves gain programming using a voltage difference of two pairs of floating voltage sources.

23 Claims, 8 Drawing Sheets

(56) References Cited

OTHER PUBLICATIONS

Jaime Ramirez-Angulo et al., *The Folded Gilbert Cell: A Low Voltage High Performance CMOS Multiplier*, New Mexico State University, Department of Electrical and Computer Engineering, 0-7803-0510-8/92 © 1992 IEEE, 4 pages.

Cheong F. Chan et al., *A One Volt Four-Quadrant Analog Current Mode Multiplier Cell*, IEEE Journal of Solid-State Circuits, vol. 30, No. 9, Sep. 1995, 0018-9200/95 © 1995 IEEE, 2 pages.

Barrie Gilbert, *A Precise Four-Quadrant Multiplier with Subnanosecond Response*, Reprinted from the IEEE Journal of Solid-State Circuits, vol. 3, No. 4 (1968), 9 pages.

\* cited by examiner

US 9,735,738 B2

LOW-VOLTAGE LOW-POWER VARIABLE GAIN AMPLIFIER

TECHNICAL FIELD OF THE DISCLOSURE

The present invention relates to the field of integrated circuits, in particular to low-voltage low-power variable gain amplifier.

BACKGROUND

Electronics are made up of integrated circuits. Integrated circuits process signals and perform a myriad of functions. Analog circuitry is a group of circuits which processes signals in analog form (i.e., continuous, variable signals). One common analog circuit is the variable gain amplifier. The variable gain amplifier is a circuit which amplifies an input signal based on a gain coefficient. The gain coefficient can be varied or adjusted according to a control voltage. The variable gain amplifier is found in many audio applications and optical communications applications. Even though there are many well-established circuit topologies for the variable gain amplifier, ever-changing requirements imposed on the variable gain amplifier continue to make it difficult to design and implement a variable gain amplifier.

BRIEF SUMMARY OF THE DISCLOSURE

In high speed communication applications, e.g., optical communication, a variable gain amplifier is used for input signal amplitude normalization or for linear equalization. Traditionally a bipolar Gilbert multiplier circuit is used. When moving towards a low-power application, a modified circuit topology is implemented to reduce the minimum supply voltage requirement of the variable gain amplifier while ensuring that bias current levels remain substantially the same and achieving the same current switching capacity as the traditional circuit. As a result, the power consumption of the circuit can be greatly reduced. The modified circuit topology combines the amplifier and gain transistors and achieves gain programming using a voltage difference of two pairs of floating voltage sources.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Basics of Variable Gain Amplifiers

Variable gain amplifiers (VGAs) are commonly used in electronics. An input to the variable gain amplifier can be amplified based on a gain coefficient to generate an amplified output. The gain coefficient can be varied or controlled by a control voltage. Generally speaking, a variable gain amplifier can provide signal-conditioning with electronically settable voltage gain. Variable gain amplifiers are used in a variety of remote sensing and communications equipment. Applications ranging from ultrasound, radar, lidar, wireless communications, and speech analysis have utilized variable gain in to enhance dynamic performance. VGAs can tame signals that exhibit wide dynamic range. For example, input signals to wireless receives can range from microvolts to volts. VGAs can be found in communications, cable TV, medical equipment, and industrial applications.

In many high speed communication applications, including optical communication, a variable gain amplifier is utilized for the input signal amplitude normalization or for linear equalization. Many VGAs are implemented in cascade, where the output of one VGA is connected to the input of another VGA. Applications requiring many VGAs makes the system and block level power consumption one of the key design parameter differentiating an offered product to the market.

Figure 1:
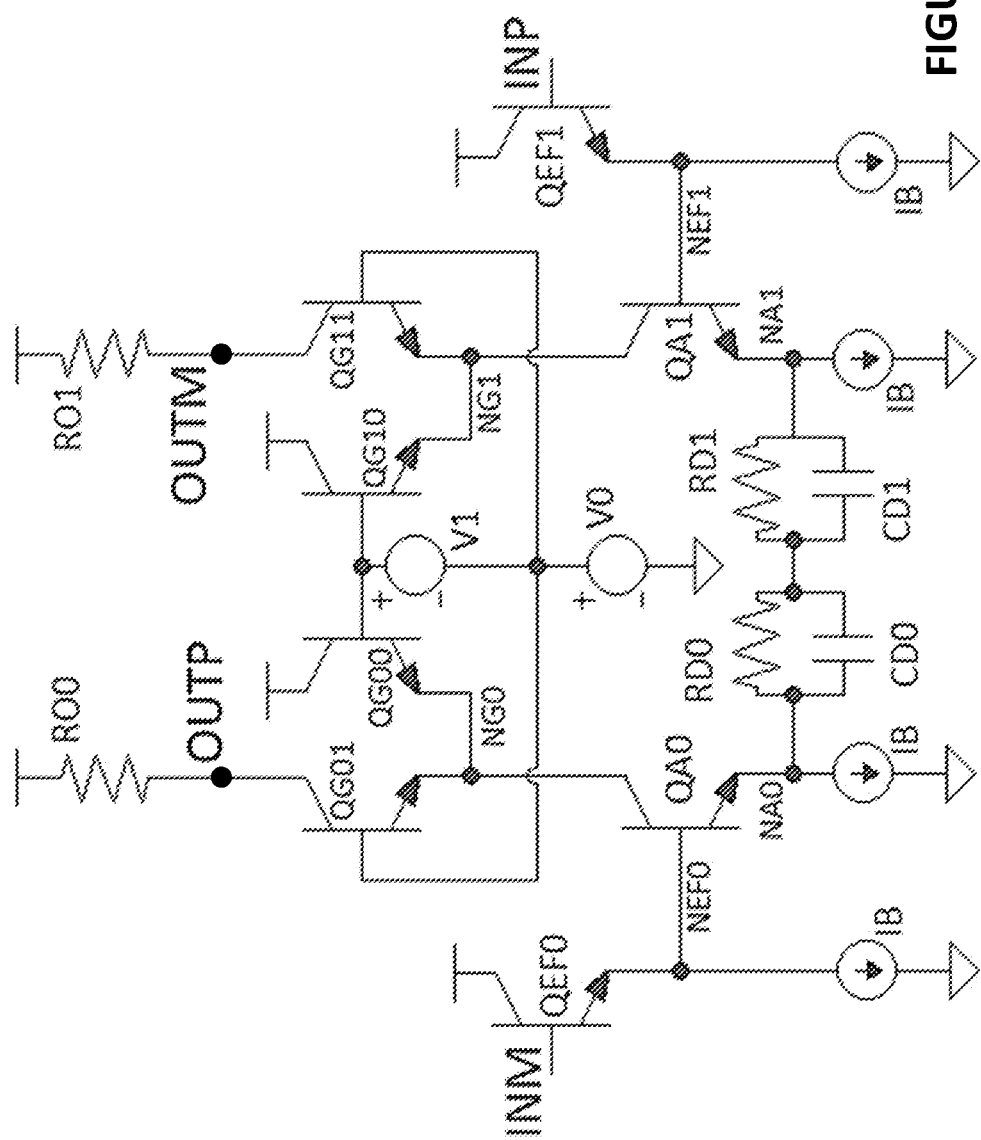
FIG. 1 shows a traditional bipolar Gilbert multiplier circuit.

Understanding Shortcomings of the Traditional Bipolar Gilbert Multiplier Circuit Due to the high-frequency input signal content, the VGA bandwidth requirement mandates the use of bipolar devices for such applications. Traditionally, a bipolar Gilbert multiplier circuit is used. FIG. 1 shows a traditional bipolar Gilbert multiplier circuit. The circuit has two emitter followers, $Q_{EF0}$ and $Q_{EF1}$ two amplifier transistors $Q_{A0}$ and $Q_{A1}$, and four gain transistors $Q_{G01}$, $Q_{G00}$, $Q_{G10}$, and $Q_{G11}$. Differential inputs to the circuit are $IN_M$ and $IN_P$, and the differential outputs of the circuit are $OUT$ and $OUT_M$. The topology shown in the FIGURE can realize only positive signed multiplication factors, but it is also possible to implement both positive and negative multiplication factors by cross connecting the output transistors $Q_{G00}$ and $Q_{G10}$ to the output nodes $OUT_M$ and $OUT_P$, respectively. The circuit operates as follows, the emitter followers $Q_{EF0}$ and $Q_{EF1}$ buffer the input signals $IN_M$ and $IN$ to the nodes $N_{EF0}$ and $N_{EF1}$, respectively. The buffered input signals are then converted to a difference current using $Q_{A0}$, $R_{D0}$, $R_{D1}$ and $Q_{A1}$. Assuming the transconductances of $Q_{A0}$ and $Q_{A1}$ are much bigger than the conductances of $R_{D0}$ and $R_{D1}$, the difference current that is the half of the collector current difference of $Q_{A0}$ and $Q_{A1}$ can be expressed as follows:

$$I_\Delta = \frac{V_{INP} - V_{INM}}{R_{D0} + R_{D1}} = \frac{\Delta V_{IN}}{R_D}$$

$\Delta V_{IN}$ is equal to $(V_{INP} - V_{INM})$ and degeneration resistors $R_{D0}$ and $R_{D1}$ are equal to 0.5 $R_D$. The collector currents of $Q_{40}$ and $Q_{41}$, $I_{CQA1}$ and $I_{CQA0}$ respectively, can be expressed as follows:

$$I_{OQA1} = I_B + I_\Delta$$

$$I_{OQA0} = I_B - I_\Delta$$

The collector currents of $Q_{40}$ and $Q_{41}$ are then divided by the transistor pairs $Q_{G00}$, $Q_{G01}$ and $Q_{G10}$, $Q_{G11}$, respectively. The collector currents of $Q_{G11}$ and $Q_{G01}$, $I_{CQG11}$ and $I_{CQG01}$ respectively, are driving the output nodes, and the collector currents can be expressed as follows:

$$I_{CQG11} = \frac{1}{1 + \exp\left(\frac{V_1}{V_T}\right)} I_{CQA1} \quad I_{CQG01} = \frac{1}{1 + \exp\left(\frac{V_1}{V_T}\right)} I_{CQA0}$$

$V_T$ is the thermal voltage. Hence, the gain factor or gain coefficient of the traditional Gilbert multiplier circuit, i.e., K, is:

$$K = \frac{1}{1 + \exp\left(\frac{V_1}{V_T}\right)}$$

It is possible to set the desired gain factor by properly adjusting the gain control voltage $V_1$. As seen in FIG. 1, $V_1$ is the voltage source connected to the base terminals of $Q_{G00}$ and $Q_{G10}$. The voltage source $V_0$ sets the direct current (DC) operating point to generate proper voltage headroom for amplifier transistors $Q_{40}$ and $Q_{41}$ to operate. The gain factor K is bounded within the interval (0-1). For $V_1$ equal to 0, the gain K is 0.5. The output signal, i.e., the difference of the voltages $OUT_P$ and $OUT_M$, is obtained by converting the collector currents of $Q_{G01}$ and $Q_{G11}$ to output voltages using the resistors $R_{O0}$ and $R_{O1}$. Assuming the output resistors are equal to $R_O$, the transfer function of the traditional Gilbert multiplier circuit can be written as:

$$H = \frac{V_{OUT}}{V_{IN}} = \frac{V_{OUTP} - V_{OUTM}}{V_{INP} - V_{INM}} = 2K \frac{R_O}{R_D}$$

The degeneration capacitors $C_{D0}$ and $C_{D1}$ generate peaking at high frequencies to extend the multiplier bandwidth further. The minimum supply voltage requirement, i.e. $V_{CCmin}$, of the prior-art Gilbert multiplier circuit can be expressed as follows:

$$V_{CCmin} = 2V_{BE} + V_{CIB} + \frac{1}{2}V_{OUTpp} + \frac{1}{2}V_{INpp}$$

The bipolar transistor base-emitter voltage is denoted as $V_{BE}$, the compliance voltage of the current sources (compliance voltage of the current source $I_B$ generating a bias current) is denoted as $V_{CIB}$, the peak-to-peak output signal voltage (peak-to-peak voltage at the differential output nodes) is denoted as $V_{OUTpp}$ and the peak-to-peak input signal (peak-to-peak voltage at the differential input nodes) is denoted as $V_{INpp}$. It is a common design practice to choose the base-collector voltage difference $V_{BC}$ of the bipolar transistors larger than 0 Volts (V) for high speed design to reduce the parasitic collector-base capacitance. While calculating the minimum supply voltage requirement, it is assumed that the bandwidth requirement is satisfied for $V_{BC}$ equal to 0 V. Hence $V_{BC}$ is treated as equal to $V_{BE}$. If the required $V_{BC}$ is larger, the extra voltage should be added to $V_{CCmin}$. Assuming the input and output peak-to-peak signal swing is 300 millivolts (mV), $V_{BE}$ and $V_{CIB}$ are equal to 800 mV and 400 mV, respectively, the minimum achievable supply voltage level is 2.3V. In practice, $V_{CCmin}$ is generally greater than 2.3 V. Higher supply voltage level generally means greater power consumption (with all other factors held constant).

The Modified Circuit Topology: Low-Voltage Low-Power Variable Gain Amplifier

To reduce the minimum supply voltage requirement, the multiplier is redesigned to utilize a different topology so that variable gain amplification function can be provided without requiring stacking of transistors such as $Q_{G01}$ and $Q_{40}$ as seen in FIG. 1. As a result, the headroom requirement is reduced. The modified circuit topology is not trivial.

Figure 2:
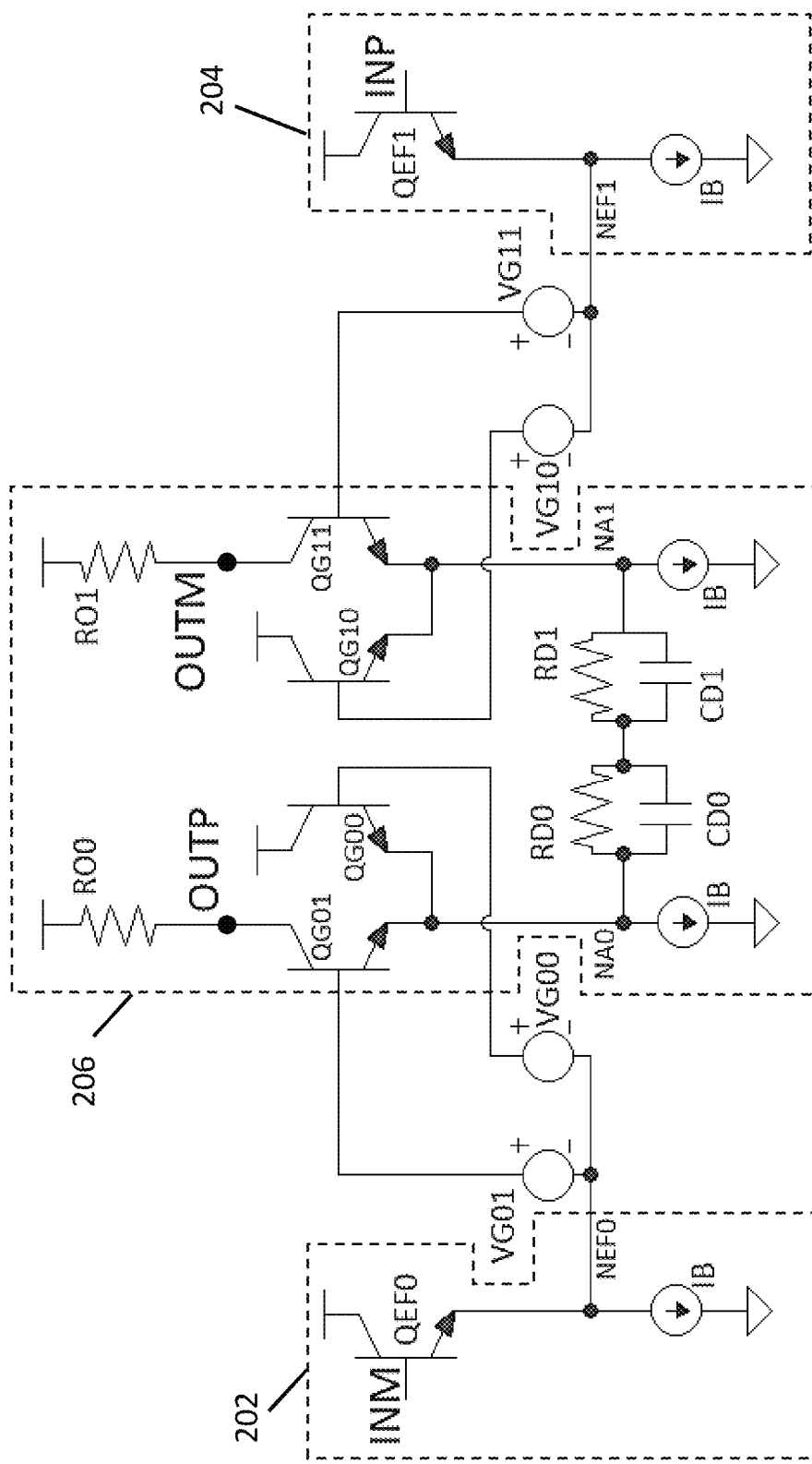
FIG. 2 shows a low-voltage low-power variable gain amplifier, according to some embodiments of the disclosure.

FIG. 2 shows a low-voltage low-power variable gain amplifier, according to some embodiments of the disclosure. The modified circuit topology combines the amplifier transistors ($Q_{40}$ and $Q_{41}$) and the gain transistors ($Q_{G00}$, $Q_{G01}$, $Q_{G10}$ and $Q_{G11}$) seen in FIG. 1 and achieves the gain programming using the voltage difference $V_G$ of two pairs of floating voltage sources, [$V_{G01}$, $V_{G00}$] and [$V_{G10}$, $V_{G11}$]. The operating points of the bipolar transistors and the passive component values are identical to the topology seen in FIG. 1. Hence, the alternating current (AC) response of both amplifiers are identical. The signal bandwidth of the floating voltage sources can match (or be bigger than) the desired signal bandwidth. The minimum power supply requirement of the modified circuit is greatly relaxed.

The amplifier includes differential input nodes $IN_M$ and $IN_P$ receiving differential input voltages, and differential output nodes $OUT_P$ and $OUT_M$ for outputting differential output voltages, where the differential output voltage is the differential input voltage amplified by the variable gain setting of the amplifier. The amplifier has first differential voltage nodes, $N_{EF0}$ and $N_{EF1}$, which buffers or follows differential input voltages at differential input nodes $IN_M$ and $IN_P$ respectively based on a first fixed voltage change. In this example, $N_{EF0}$ and $N_{EF1}$ are emitter nodes of emitter followers, $Q_{EF0}$ and $Q_{EF1}$ respectively. $IN_M$ drives the base of transistor $Q_{EF0}$ and the emitter node $N_{EF0}$ follows $IN_M$ with a voltage drop (i.e., the first fixed voltage change) of one base-emitter voltage $V_{BE}$. $IN_P$ drives the base of transistor $Q_{EF1}$ and the emitter node $N_{EF1}$ follows $IN_P$ with a voltage drop (i.e., the first fixed voltage change) of one base-emitter voltage $V_{BE}$.

The amplifier changes its gain by controlling a current which is divided by a pair current branches. Phrased differently, the pair of current branches can be controlled to allow a percentage of a current to flow through one branch (i.e., the output branch) versus another branch (i.e., not the output branch). The current being divided has a component which is based on the input voltages at $IN_M$ and $IN_P$. The variable gain setting of amplifier would be based at least on such percentage. The amplifier includes first current branches driving differential output nodes, e.g., $Q_{G01}$ driving $OUT_P$, and $Q_{G11}$ driving $OUT_M$. Furthermore, the amplifier includes second current branches, e.g., $Q_{G00}$ and $Q_{G10}$, paired with respective first current branches, e.g., $Q_{G01}$, $Q_{G11}$ respectively, to divide, according to a coefficient K, a bias current $I_B$ and a difference current $I_\Delta$ representative of the differential input voltages. The overall variable gain setting of the amplifier depends on the coefficient K.

To control the coefficient K, the amplifier includes first floating voltage sources $V_{G01}$, $V_{G11}$ having the same first predetermined voltage change/shifts and second voltage sources $V_{G00}$, $V_{G10}$ having the same second predetermined voltage change/shifts. The floating voltage sources controls the current division described above by imposing a voltage difference $V_G$ between the first predetermined voltage change/shift and the second voltage change/shift. Two identical pairs of the first floating voltage source and the second voltage source are implemented for both sides of the circuit. For proper operation, the voltages shift/change implemented by floating voltage sources $V_{G01}$ and $V_{G11}$ are identical, and the voltage shift/change implemented by floating voltage sources $V_{G00}$ and $V_{G10}$ are identical. $V_{G01}=V_{G11}$, and $V_{G00}=V_{G10}$. The voltage difference $V_G$ is $V_{G01}-V_{G00}=V_{G11}-V_{G10}$.

Each one of the first floating voltage sources $V_{G01}$, $V_{G11}$ is coupled between respective one of the first differential voltage nodes ($N_{EF0}$ or $N_{EF1}$) and respective one of first current branches (base of transistors $Q_{G01}$ or $Q_{G11}$ respectively) to provide a first predetermined voltage change. For instance, $V_{G01}$ is connected between $N_{EF0}$ and base of $Q_{G01}$. $V_{G11}$ is connected between $N_{EF1}$ to the base of $Q_{G11}$. Each one of the second floating voltage sources $V_{G00}$, $V_{G10}$ is coupled between respective one of the first differential voltage nodes ($N_{EF0}$ or $N_{EF1}$) and respective one of second current branches ($Q_{G00}$ or $Q_{G10}$) respectively to provide a second predetermined change in the same direction as the first predetermined voltage change. For instance, $V_{G00}$ is connected between $N_{EF0}$ and base of $Q_{G00}$. $V_{G10}$ is connected between $N_{EF1}$ to the base of $Q_{G10}$. Notably, the floating voltages are in the signal path from the input to the output of the amplifier. Each one of the first current branches comprises a bipolar transistor $Q_{G01}$ or $Q_{G11}$ whose base (or base terminal) is driven by a respective first floating voltage source $V_{G01}$ or $V_{G11}$. Each one of the second current branches comprises a bipolar transistor $Q_{G00}$, $Q_{G10}$ whose base (or base terminal) is driven by a respective second floating voltage source $V_{G00}$ or $V_{G10}$.

One aspect of the circuit topology is the directions of voltage shifts experienced from the input to the output. Another aspect of the circuit topology is the magnitudes of the voltage shifts provided by the floating voltage sources. The directions and magnitudes of the voltage shifts are set specifically to ensure low-headroom operation (to relax $V_{CCmin}$). The first predetermined voltage change ($V_{G10}$, $V_{G11}$) and the second predetermined voltage change ($V_{G00}$ and $V_{G10}$) correspond to the first fixed voltage change ($V_{BE}$ of $Q_{EF0}$, VBE of $Q_{EF1}$) in magnitude but in an opposite direction. Accordingly, $V_{G01}$, $V_{G11}$, $V_{G00}$, and $V_{G10}$ can offset the one $V_{BE}$ voltage drop of the emitter follower by shifting the voltage up somewhat close to one $V_{BE}$. Accordingly, the first predetermined voltage change $V_{G01}$ and $V_{G11}$ and the second predetermined voltage change $V_{G00}$ and $V_{G10}$ are set to substantially offset the one base-emitter voltage $V_{BE}$ in the opposite direction. This opposite direction of voltage shift provided by the floating voltage sources in the topology of FIG. 2 is in contrast to the two $V_{BE}$ voltage drops seen in the topology of FIG. 1 (i.e., voltage drops due to $Q_{EF0}$ and $Q_{A0}$ in the same direction, and voltage drops due to $Q_{EF1}$ and $Q_{A1}$ in the same direction). As a result the circuit can operate with reduced supply voltage requirement and greatly reduce power consumption. Generally speaking, the first predetermined voltage change $V_{G01}$ and $V_{G11}$ and the second predetermined voltage change $V_{G00}$ and $V_{G10}$ are set to be less than one base-emitter voltage $V_{BE}$ in the opposite direction to improve distortion or bandwidth. While it is not preferred, the first predetermined voltage change $V_{G01}$ and $V_{G11}$ and the second predetermined voltage change $V_{G00}$ and $V_{G10}$ can be set to offset more than one base-emitter voltage $V_{BE}$ in the opposite direction.

Yet another aspect of the circuit topology is the setting of the variable gain of the amplifier through the floating voltages which are in the signal path of the amplifier. A difference $V_G$ between the first predetermined voltage change and the second predetermined voltage change, $V_G=V_{G01}-V_{G00}=V_{G11}-V_{G10}$, sets the coefficient to provide variable gain of the amplifier. The difference in voltage at the bases of the transistors $Q_{G00}$, $Q_{G01}$, $Q_{G10}$ and $Q_{G11}$ controls the division of current between the pairs of current branches, wherein the current has a component therein (referred herein as the difference current) representative of the input voltages $V_{INM}$ and $V_{INP}$ at nodes $IN_M$ and $IN_P$.

The constraints and functions of the floating voltage sources are unique. The first and second predetermined voltage changes/shifts are selected properly to not only to reduce the minimum supply voltage, but to also realize the variable gain coefficient of the amplifier. These floating voltage sources are not provided to reduce noise or distortions of the amplifier (e.g., for trimming purposes). In one example, the first and second predetermined voltage changes/shifts is on the order of a few hundred millivolts (mV), e.g., 1 $V_{BE}$ or 700-900 mV. The voltage difference $V_G$ can be on the order of a hundred millivolts (mV). For instance, the voltage difference $V_G$ (i.e., the programming voltage) can be between −150 mV to 150 mV.

While the topology shown realizes only positive signed multiplication factors, it is also envisioned by the disclosure to implement both positive and negative multiplication factors by cross connecting the output transistors $Q_{G00}$ and $Q_{G10}$ to the output nodes $OUT_M$ and $OUT_P$ respectively.

The Low-Voltage Low-Power Variable Gain Amplification System

At a system level, the low-voltage low-power variable gain amplifier includes a first input buffer 202, a second input buffer 204, an output stage 206, two sets of floating voltage sources (labeled as $V_{G01}$, $V_{G00}$, $V_{G10}$, and $V_{G11}$) as a first gain setting stage and a second gain setting stage. The first input buffer, which includes transistor $Q_{EF0}$, follows a first one of the differential inputs ($IN_M$). The second input buffer 204, which includes transistor $Q_{EF1}$, follows a second one of the differential input ($IN_P$). The output stage, which includes transistors $Q_{G01}$, $Q_{G00}$, $Q_{G10}$, and $Q_{G11}$, and nodes $N_{A0}$ and $N_{A1}$, replicates a voltage difference of the differential inputs at nodes $N_{A0}$ and $N_{A1}$ and converts the replicated voltage difference to a difference current $I_\Delta$ independent of the gain setting. The first gain setting stage controls the output stage, and the stage includes a first floating voltage source $V_{G01}$ and a second floating voltage source $V_{G00}$ for shifting an output of the first input buffer (node $N_{EF0}$) by a first predetermined voltage change ($V_{G01}$) and a second predetermined voltage change ($V_{G00}$) respectively. In the same fashion, the second gain setting stage controls the output stage, and the stage comprises a third floating voltage source $V_{G11}$ and a fourth floating voltage source $V_{G10}$ for shifting an output of the second input buffer (node $N_{EF1}$) by the first predetermined voltage change ($V_{G11}$) and the second predetermined voltage change ($V_{G10}$) respectively. The difference $V_G$ between the first predetermined voltage change and the second predetermined voltage change sets a gain setting K being applied to a bias current $I_B$ and the difference current $I_\Delta$ to provide a variable gain of the amplifier.

Figure 3:
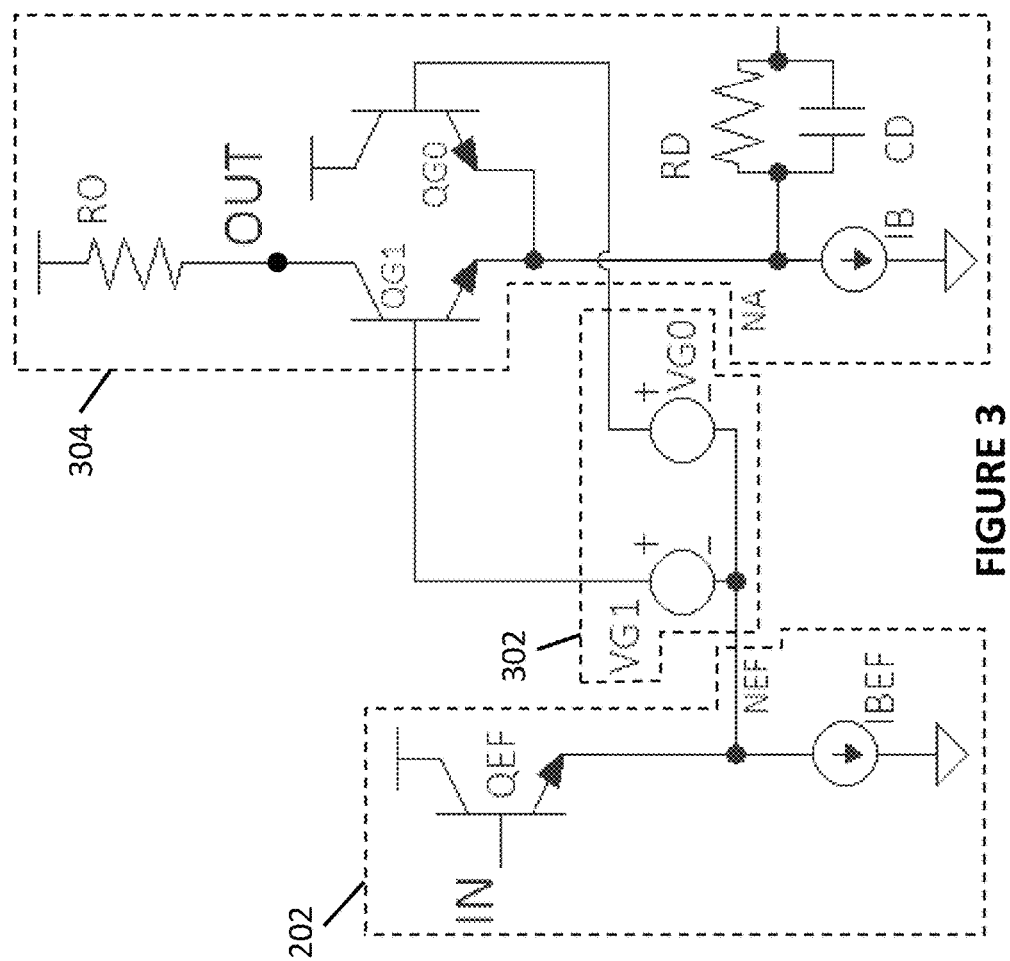
FIG. 3 shows one side of the low-voltage low-power variable gain amplifier, according to some embodiments of the disclosure.

FIG. 3 shows one side of the low-voltage low-power variable gain amplifier, according to some embodiments of the disclosure. Specifically, the FIGURE shows the left side of the circuit seen in FIG. 2. Generally speaking, the same circuit is duplicated for the right hand side, and thus is not shown for simplicity. The half circuit illustrated in FIG. 3 includes an input buffer 202 having transistor $Q_{EF}$ (emitter follower), a pair of floating voltage sources $V_{G1}$, $V_{G0}$ as a gain setting stage 302, and an output stage (or half of an output stage) 304 having transistors $Q_{G1}$, $Q_{G0}$, and node $N_A$). The voltage shifts/changes of the floating voltage sources are set according to the embodiments described herein to provide the variable gain of the amplifier. Varied exemplary implementations of the gain setting stage 302 having the floating voltage sources $V_{G1}$, $V_{G0}$ are illustrated in detail in FIGS. 5-7 (with respect to the half circuit shown in FIG. 3).

Note that the exemplary implementations has a low frequency DC path that is used to convey the input signal at low frequencies and to set the gain factor. The implementations also has a high frequency path through a coupling capacitor to convey the input signal at high frequencies. The variations differ in terms of DC signal path implementation. Generally speaking the implementations includes programmable current sources (referred herein as $I_1$ and $I_0$) to generate the floating voltage sources. It is noted that the programmable current sources are far smaller than the bias current $I_B$ seen in the topologies herein. When the programmable current sources are not chosen for speed, and with the proper settings of other parts of the programmable voltage sources (e.g., resistor values), the programmable current sources can be on the order of tens to hundreds of micro-Amps (uA) when the bias current $I_B$ is on the order of several milliamps (mA). For instance, the bias current $I_B$ can be 1-5 mA, and the programmable current sources $I_1$ and $I_0$ can be 10-300 uA.

Generating the Difference Current without Amplifier Transistors of the Traditional Gilbert Multiplier Circuit For proper operation, the voltage $V_{G01}$ is set to be identical to $V_{G11}$ and the voltage $V_{G00}$ is set to be identical to $V_{G10}$. Referring back to FIG. 2, the emitter followers $Q_{EF0}$ and $Q_{EF1}$ buffer the input signals $IN_M$ and $IN_P$ to the nodes $N_{EF0}$ and $N_{EF1}$, respectively. The buffered input signals are then voltage shifted to drive the base terminals of transistors $Q_{G00}$, $Q_{G01}$, $Q_{G10}$ and $Q_{G11}$. The bipolar transistor pairs $Q_{G00}$-$Q_{G01}$ and $Q_{G10}$-$Q_{G11}$ form maximum circuit to generate the voltage on nodes $N_{A0}$ and $N_{A1}$. Due to the fact that the voltage changes/shifts of $V_{G01}$ and $V_{G00}$ on the left side of the circuit have to be identical to the voltage changes/shifts of $V_{G11}$ and $V_{G10}$ on the right side of the circuit, the voltage shifts from $IN_M$ and $IN_P$ nodes to $N_{A1}$ and $N_{A0}$ nodes respectively have to be identical as well. Hence, the two sides of the circuit copy the respective input voltages $V_{INM}$ or $V_{INP}$ to respective $N_{A0}$ or $N_{A1}$ nodes, to convert the input voltage difference to a difference current $I_\Delta$. The difference current $I_\Delta$ is thus representative of the input voltages $V_{INM}$ and $V_{INP}$ at nodes $IN_M$ and $IN_P$.

Assuming the sum of transconductances of transistors $Q_{G00}$-$Q_{G01}$ and $Q_{G10}$-$Q_{G11}$ are much bigger than the conductances of $R_{D0}$ and $R_{D1}$ (since the bias current $I_B$ of FIG. 2 is the same as the topology of FIG. 1, the equivalent transconductances are identical for both topologies), the difference current $I_\Delta$ can be expressed as follows:

$$I_\Delta = \frac{V_{INP} - V_{INM}}{R_{D0} + R_{D1}} = \frac{\Delta V_{IN}}{R_D}$$

$\Delta V_{IN}$ is equal to $(V_{INP} - V_{INM})$ and the degeneration resistors $R_{D0}$ and $R_{D1}$ are equal to $0.5 R_D$.

Referring again to FIG. 2, the circuit includes a first node $N_{A0}$ at the emitters of transistors in a first one of the first current branches $Q_{G01}$ and a first one of the second current branches $Q_{G00}$ a second node $N_{A1}$ at the emitters of transistors in a second one of the first current branches $Q_{G11}$ and a second one of the second current branches $Q_{G10}$. The voltage difference of the differential input voltages $V_{INP} - V_{INM}$ is replicated at the first node $N_{A0}$ and the second node $N_{A1}$ through the first and second floating voltage sources $V_{G01}$, $V_{G00}$, $V_{G10}$, $V_{G11}$ and the first and second current branches $Q_{G01}$, $Q_{G00}$, $Q_{G10}$, and $Q_{G11}$. Notably, no amplification transistors ($Q_{A0}$ and $Q_{A1}$ of FIG. 1) are used to replicate the input voltage. The circuit further includes a resistance, $R_{D0}$ and $R_{D1}$, between the first node $N_{A0}$ and the second node $N_{A1}$. The difference current $I_\Delta$ is the voltage difference replicated at the first node $N_{A0}$ and the second node $N_{A1}$ divided by the resistance $R_D = R_{D0} + R_{D1}$.

In some embodiments, the circuit includes second differential voltage nodes $N_{A0}$ and $N_{A1}$ replicating a voltage difference $\Delta V_{IN}$ of the differential input voltages through the first differential voltage nodes $N_{EF0}$, $N_{EF1}$, the first and second floating voltage sources $V_{G01}$, $V_{G00}$, $V_{G10}$, $V_{G11}$, and the first and second current branches $Q_{G01}$, $Q_{G00}$, $Q_{G10}$, and $Q_{G11}$. The difference current $I_\Delta$ is generated by the replicated voltage difference across a resistance $R_D = R_{D0} + R_{D1}$ between the second differential voltage nodes $N_{A0}$ and $N_{A1}$.

In some embodiments, the difference current $I_\Delta$ is generated by a replicated voltage difference across a resistance $R_D = R_{D0} + R_{D1}$. The replicated voltage difference is based on (1) a first one of the differential input voltage $IN_M$ shifted by a fixed amount comprising the first predetermined voltage change and the second predetermined voltage change (e.g., $V_{G01}$ and $V_{G00}$), and (2) a second one of the differential input voltage ONO shifted by the same fixed amount (e.g., $V_{G11}$ and $V_{G00}$). Notably, the input voltage difference can be replicated even through the floating voltage sources ($V_{G01}$, $V_{G00}$, $V_{G11}$, $V_{G00}$) because the pair of floating voltage sources provides the same voltage changes/shifts on both sides of the circuit.

Advantageously, the circuit illustrated in FIG. 2 can generate a difference current $I_\Delta$ that is independent from the difference $V_G$ between the first predetermined voltage change ($V_{G01}$ or $V_{G11}$) and the second predetermined voltage change ($V_{G00}$ or $V_{G10}$).

In some embodiments, the difference between the first predetermined voltage change and the second predetermined voltage change is on the order of a hundred millivolts. Phrased differently VG can be roughly +100 mV or −100 mV, e.g., within the range of −150 mV to +150 mV. Generally speaking, the first predetermined voltage change and the second predetermined voltage change are on the order of 1 $V_{BE}$ (e.g., 700-900 mV).

Referring back to FIG. 2, the sum of emitter currents of transistors $Q_{G00}$-$Q_{G01}$ and transistors $Q_{G10}$-$Q_{G11}$ (having a bias current $I_B$ and a difference current $I_\Delta$ component) can be expressed as follows:

$$I_{EQG10} + I_{EQG11} = I_B + I_\Delta$$

$$I_{EQG00} + I_{EQG01} = I_B + I_\Delta$$

The collector currents of $Q_{G01}$ and $Q_{G11}$ are driving to the output nodes. Assuming $V_{G00}-V_{G01}=V_{G10}-V_{G11}=V_G$, the collector currents can be expressed as follows:

$$I_{CQG11} = \frac{1}{1+\exp\left(\frac{V_G}{V_T}\right)}(I_B+I_\Delta) \quad I_{CQG01} = \frac{1}{1+\exp\left(\frac{V_G}{V_T}\right)}(I_B-I_\Delta)$$

$V_T$ is the thermal voltage. Hence, the gain factor or coefficient, i.e., K, can be expressed as:

$$K = \frac{1}{1+\exp\left(\frac{V_G}{V_T}\right)}$$

It is possible to set the desired gain factor by adjusting the gain control voltage $V_G$, properly. The gain factor K is bounded within the interval (0-1). For $V_G$ equal to 0, the gain K is 0.5. The output signal that is the difference of the voltages $OUT_P$ and $OUT_M$ is obtained by converting the collector currents of $Q_{G01}$ and $Q_{G11}$ to output voltages using the resistors $R_{O0}$ and $R_{O1}$. Assuming the output resistors are equal to $R_O$, the transfer function can be written as:

$$H = \frac{V_{OUT}}{V_{IN}} = \frac{V_{OUTP}-V_{OUTM}}{V_{INP}-V_{INM}} = 2K\frac{R_O}{R_D}$$

The degeneration capacitors $C_{D0}$ and $C_{D1}$ generate peaking at high frequencies to extend the multiplier bandwidth further.

The gain factor or gain coefficient K controls an amount of the bias current $I_B$ and the difference current $I_\Delta$ representative of the differential input voltages (e.g., $IB+I_\Delta$ or $IB-I_\Delta$) flowing through the first current branches (e.g., $Q_{G01}$, $Q_{G11}$) towards the output nodes $OUT_P$, $OUT_M$) and a remaining amount of the bias current $I_B$ and the difference current $I_\Delta$ representative of the differential input voltages (e.g., $I_B+I_\Delta$ or $I_B-I_\Delta$) flowing through the second current branches (e.g., $Q_{G00}$, $Q_{G11}$) to achieve the variable gain of the amplifier. When the floating voltages are set properly with the appropriate $V_G$, the gain coefficient K can be varied.

Reduced Minimum Supply Voltage

The minimum supply voltage, i.e. $V_{CCmin}$, requirement of the variable gain amplifier illustrated in FIG. 2 can be expressed as follows:

$$V_{CCmin} = V_{BE} + V_{CIB} + \frac{1}{2}V_{OUT_{pp}} + \frac{1}{2}V_{IN_{pp}}$$

The bipolar transistor base-emitter voltage is denoted as $V_{BE}$, the compliance voltage of the current sources $I_B$ is denoted as $V_{CIB}$, the peak-to-peak output signal (peak-to-peak voltage at the differential output nodes) is denoted as $V_{OUTpp}$ and the peak-to-peak input signal (peak-to-peak voltage at the differential input nodes) is denoted as $V_{INpp}$. In other words, the amplifier has a minimum supply voltage requirement $V_{CCmin}$ comprising one base-emitter voltage $V_{BE}$, compliance voltage of a current source generating the bias current $V_{CIB}$, half of peak-to-peak voltage at the differential input nodes ½ $V_{INPP}$, and half of peak-to-peak voltage at the differential output nodes ½ $V_{OUTPP}$.

Note that the extra voltage headroom requirement for gain programming is ignored for purposes of comparing the topology of FIG. 1 and FIG. 2 (in some cases, the required extra voltage headroom is on the order of 75 mV). While calculating the minimum supply voltage, i.e. $V_{CCmin}$, requirement of the variable gain amplifier illustrated in FIG. 2, it is assumed that the bandwidth requirement is satisfied for $V_{BC}$ equal to 0 V. Hence $V_{BC}$ is treated as equal to $V_{BE}$. If the required $V_{BC}$ is larger, the extra voltage can be added to $V_{CCmin}$. For an example where the input and output peak-to-peak signal swing is 300 mV, $V_{BE}$ and $V_{CIB}$ are equal to 800 mV and 400 mV, respectively, the minimum achievable supply voltage level is 1.5V while keeping the current levels similar to the traditional Gilbert multiplier circuit. In this example, the first current branches and the second current branches comprises bipolar transistor devices $Q_{G01}$, $Q_{G00}$, $Q_{G10}$, and $Q_{G11}$, and the amplifier can operate properly with a supply voltage as low as 1.5 Volts. Moreover, the power savings of the circuit in FIG. 2 is 35% with respect to the traditional Gilbert multiplier circuit having $V_{CCmin}$ of 2.3V.

A Low-Voltage Low-Power Variable Gain Amplification Method

Figure 4:
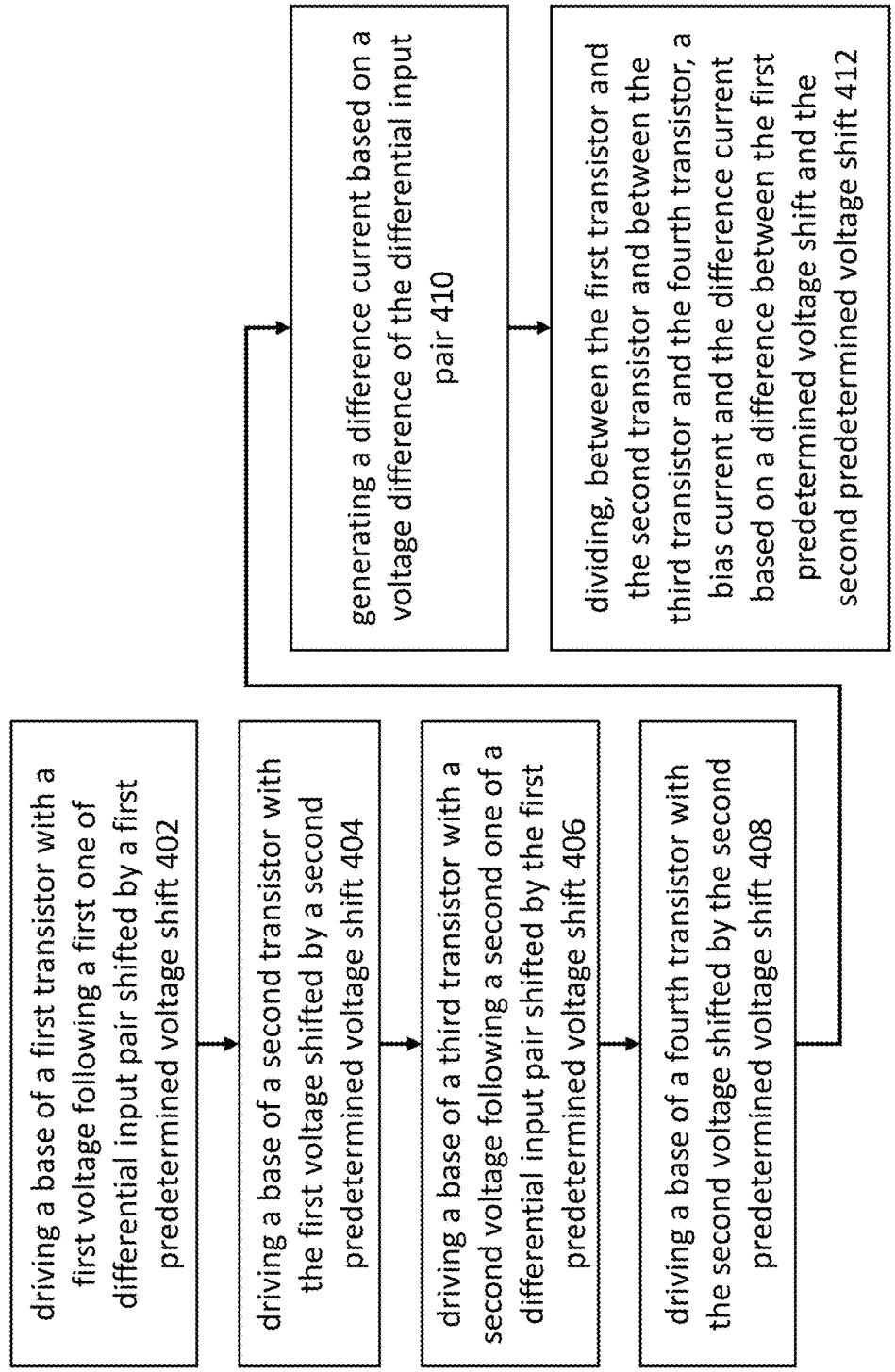
FIG. 4 is a flow diagram illustrating a low-voltage low-power variable gain amplification method, according to some embodiments of the disclosure.

FIG. 4 is a flow diagram illustrating a low-voltage low-power variable gain amplification method, according to some embodiments of the disclosure. The arrows are meant to be illustrative, and the ordering and possible parallel/sequential nature of the various parts of the method can vary.

In part 402, a base of a first transistor ($Q_{G01}$) is driven with a first voltage (voltage at $N_{EF0}$) following a first one of differential input pair ($IN_M$) shifted by a first predetermined voltage shift ($V_{G01}$). The first transistor ($Q_{G01}$) is coupled to a first one of a differential output pair ($OUT_P$). In part 404, a base of a second transistor ($Q_{G00}$) is driven with the first voltage (voltage at $N_{EF0}$) shifted by a second predetermined voltage shift ($V_{G00}$). In part 406, a base of a third transistor ($Q_{G11}$) is driven with a second voltage (voltage at $N_{EF1}$) following a second one of a differential input pair ($IN_P$) shifted by the first predetermined voltage shift ($V_{G01}=V_{G11}$) wherein the third transistor ($Q_{G11}$) is coupled to a second one of a differential output pair ($OUT_M$). In part 408, a base of a fourth transistor ($Q_{G10}$) is driven with the second voltage (voltage at $N_{EF1}$) shifted by the second predetermined voltage shift ($V_{G00}=V_{G10}$). In part 410, a difference current ($I_\Delta$) is generated based on a voltage difference of the differential input pair ($\Delta V_{IN}=V_{INP}-V_{INM}$). In part 412, a bias current and the difference current ($IB+I_\Delta$ or $IB-I_\Delta$) are divided between the first transistor ($Q_{G01}$) and the second transistor ($Q_{G00}$) and between the third transistor ($Q_{G11}$) and the fourth transistor ($Q_{G11}$), based on a difference ($V_G=V_{G01}-V_{G00}=V_{G11}-V_{G10}$) between the first predetermined voltage shift ($V_{G01}=V_{G11}$) and the second predetermined voltage shift ($V_{G00}=V_{G10}$).

In some embodiments, generating the difference current $I_\Delta$ comprises generating the difference current $I_\Delta$ independent from the difference ($V_G=V_{G01}-V_{G00}=V_{G11}-V_{G10}$) between the first predetermined voltage shift ($V_{G01}=V_{G11}$) and the second predetermined voltage shift ($V_{G00}=V_{G10}$).

In some embodiments, the method further includes replicating the voltage difference of the differential input pair ($\Delta V_{IN}=V_{INP}-V_{INM}$) using a same set of voltage shifts for both (1) a first path from the first one of the differential input pair to emitters of the first transistor and the second transistor, and (2) a second path from the second one of the differential input pair to emitters of the third transistor and the fourth transistor. In other words, the same set of voltage shifts including the pair of floating voltages sources are implemented identically on both sides of the circuit. For instance, the same set of voltage shifts comprises the first predetermined voltage shift ($V_{G01}=V_{G11}$) and the second predetermined voltage shift ($V_{G00}=V_{G10}$).

In some embodiments, the difference ($V_G=V_{G01}-V_{G00}=V_{G11}-V_{G10}$) between the first predetermined voltage shift ($V_{G01}=V_{G11}$) and the second predetermined voltage shift ($V_{G00}=V_{G10}$) corresponds to a gain coefficient (K) of a variable gain amplifier.

Advantageously, the floating voltage sources providing the predetermined voltage shifts serve to realize the variable gain of the amplifier. Moreover, the difference current $I_\Delta$ can be generated independent from the difference $V_G$ since both sides of the circuit goes through the same voltage shifts (even though the floating voltage sources are in the signal path). Phrased differently, the difference current is generated based on $\Delta V_{IN}=V_{INP}-V_{INM}$. The gain control is combined with the input and gain transistors $Q_{A0}$ and $Q_{A1}$ of FIG. 1 are no longer required.

In some embodiments, the first predetermined voltage shift ($V_{G01}=V_{G11}$) and the second predetermined voltage shift ($V_{G00}=V_{G10}$) are in an opposite direction of a voltage shift from the first one of the differential pair to the first voltage (e.g., to offset substantially 1 $V_{BE}$, or preferably to offset less than 1 $V_{BE}$). Accordingly, the floating voltage sources implementing those voltage shifts can offset the voltage drop of 1 $V_{BE}$ to relax the minimum supply voltage requirement.

In some embodiments, the method further includes converting collector currents of the first transistor ($Q_{G01}$) and the third transistor ($Q_{G11}$) to voltages at the differential output pair ($OUT_P$ and $OUT_M$) using output resistors $R_{O0}$ and $R_{O1}$. The collector currents includes a difference current $I_\Delta$ component and the gain coefficient K can be applied to control the collector current, thus controlling the voltages at the differential output pair ($OUT_P$ and $OUT_M$).

Floating Voltage Sources: Example 1

Figure 5:
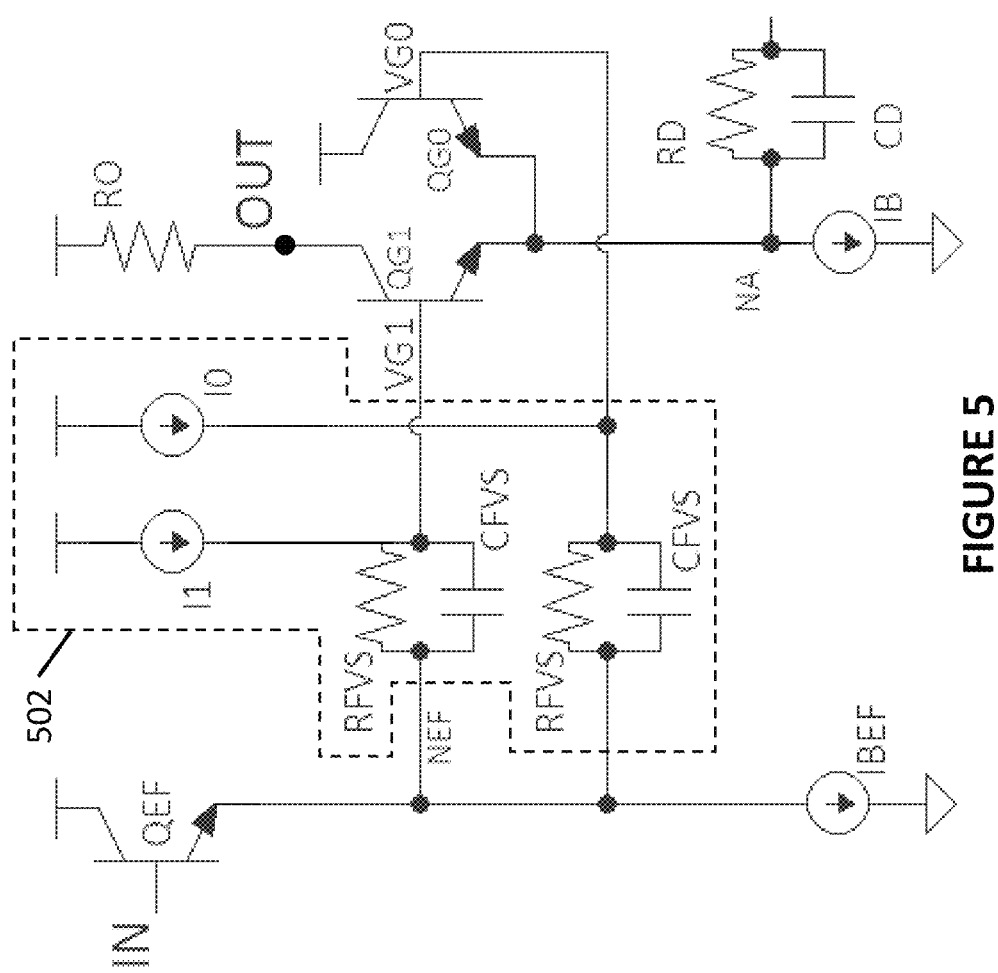
FIG. 5 shows an exemplary implementation of floating voltage sources, according to some embodiments of the disclosure.

FIG. 5 shows an exemplary implementation of floating voltage sources, according to some embodiments of the disclosure. To fix the voltage drop from the input node IN to $N_{EF}$, it is possible to fix the bias current $I_{BEF}$ of $Q_{EF}$ or equivalently fix the sum of the programming current sources $I_1$ and $I_0$. The programming current sources $I_1$ and $I_0$ can be defined as:

$$I_0 = I_{BP} + 0.5 I_\Delta$$

$$I_1 = I_{BP} - 0.5 I_\Delta$$

$I_{BP}$ is the constant part and $I_\Delta$ is varying part of the programming current (not to be confused with the difference current). The sum of the programming current sources $I_1$ and $I_0$ is $I_{TOT}$:

$$I_{TOT} = I_1 + I_0 = 2 I_{BP}$$

$$I_{BEF} = I_{QEF} + I_{TOT}$$

$I_{BEF}$, the bias current of $Q_{EF}$ is the sum of the current through transistor $Q_{EF}$ and $I_{TOT}$. The gain programming voltage, i.e. $V_G$ can be expressed as:

$$V_G = V_{G0} - V_{G1} = R_{FVS}(I_0-I_1) = R_{FVS} I_\Delta$$

The value of the resistor $R_{FVS}$ can be determined together with the value of the capacitor $C_{FVS}$ to achieve desired AC performance (zero frequency). The $R_{FVS}$ value can be chosen small enough compared to the $r_\pi$ input resistance of the $Q_{G0}$, $Q_{G1}$ transistors so that the DC gain attenuation due to the resistor divider formed by $R_{FVS}$ and $r_\pi$ is within acceptable range. Once the value of $R_{FVS}$ is determined, $I_{BP}$ can be determined to set the desired DC operating voltage level of $Q_{G1}$ and $Q_{G0}$. The programming voltage $V_G$ can be independently set by choosing $I_\Delta$ (the varying part of the programming current) properly. Note that the relationship between the desired gain factor and the varying part of the programming current $I_\Delta$ is not linear.

Floating Voltage Sources: Example 2

Figure 6:
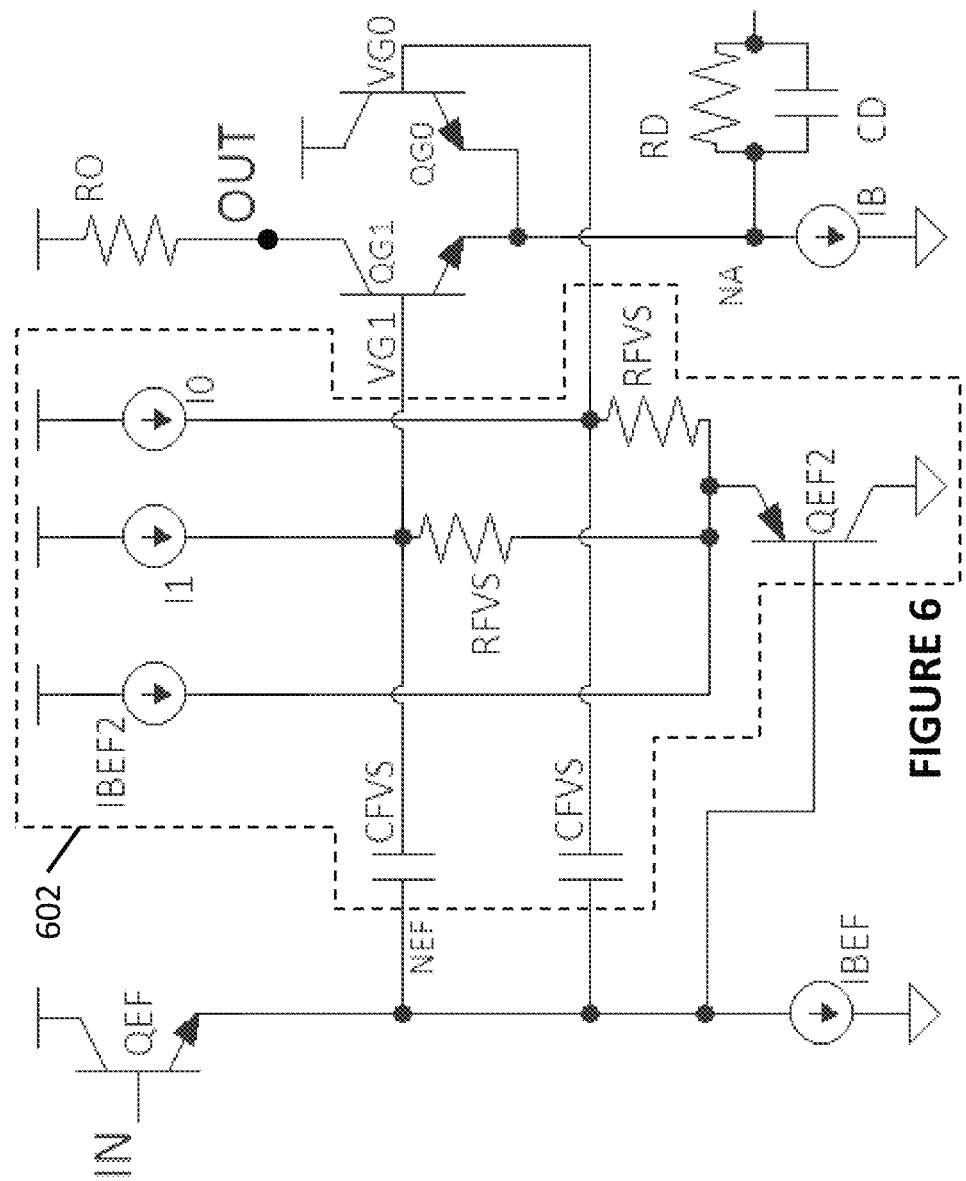
FIG. 6 shows another exemplary implementation of floating voltage sources, according to some embodiments of the disclosure.

FIG. 6 shows another exemplary implementation of floating voltage sources, according to some embodiments of the disclosure. For the technologies providing fast PNP bipolar transistors, the floating voltage sources can be implemented as shown in FIG. 6. Notably, a PNP transistor $Q_{EF2}$ is included as part of the floating voltage sources. The signal path bandwidth of this implementation is bigger than topology seen in FIG. 5. The programming current sources $I_1$ and $I_0$ can be defined as:

$$I_0 = 0.5 I_\Delta$$

$$I_1 = -0.5 I_\Delta$$

Hence, $$I_{QEF2} = I_{BEF2} + I_0 + I_1 = I_{BEF2}$$

The value of the resistor $R_{FVS}$ can be determined together with the value of the capacitor $C_{FVS}$ to achieve desired AC performance (zero frequency). This implementation allows the selection of larger $R_{FVS}$ values to pull the zero frequency on the signal path to lower frequencies. The $R_{FVS}$ values can be chosen small enough compared to the $r_\pi$ input resistance of the $Q_{G0}$, $Q_{G1}$ transistors so that the DC gain attenuation due to the resistor divided formed by $R_{FVS}$ and $r_\pi$ is within acceptable range. The bias current $I_{BEF}$ and $I_{BEF2}$ can be chosen to set the desired DC operating voltage level of $Q_{G1}$ and $Q_{G0}$. The gain programming voltage, i.e. $V_G$ can be expressed as:

$$V_G = V_{G0} - V_{G1} = R_{FVS}(I_0-I_1) = R_{FVS} I_\Delta$$

For this example as well, the relationship between the desired gain factor and the varying part of the programming current $I_\Delta$ is not linear.

Floating Voltage Sources: Example 3

Figure 7:
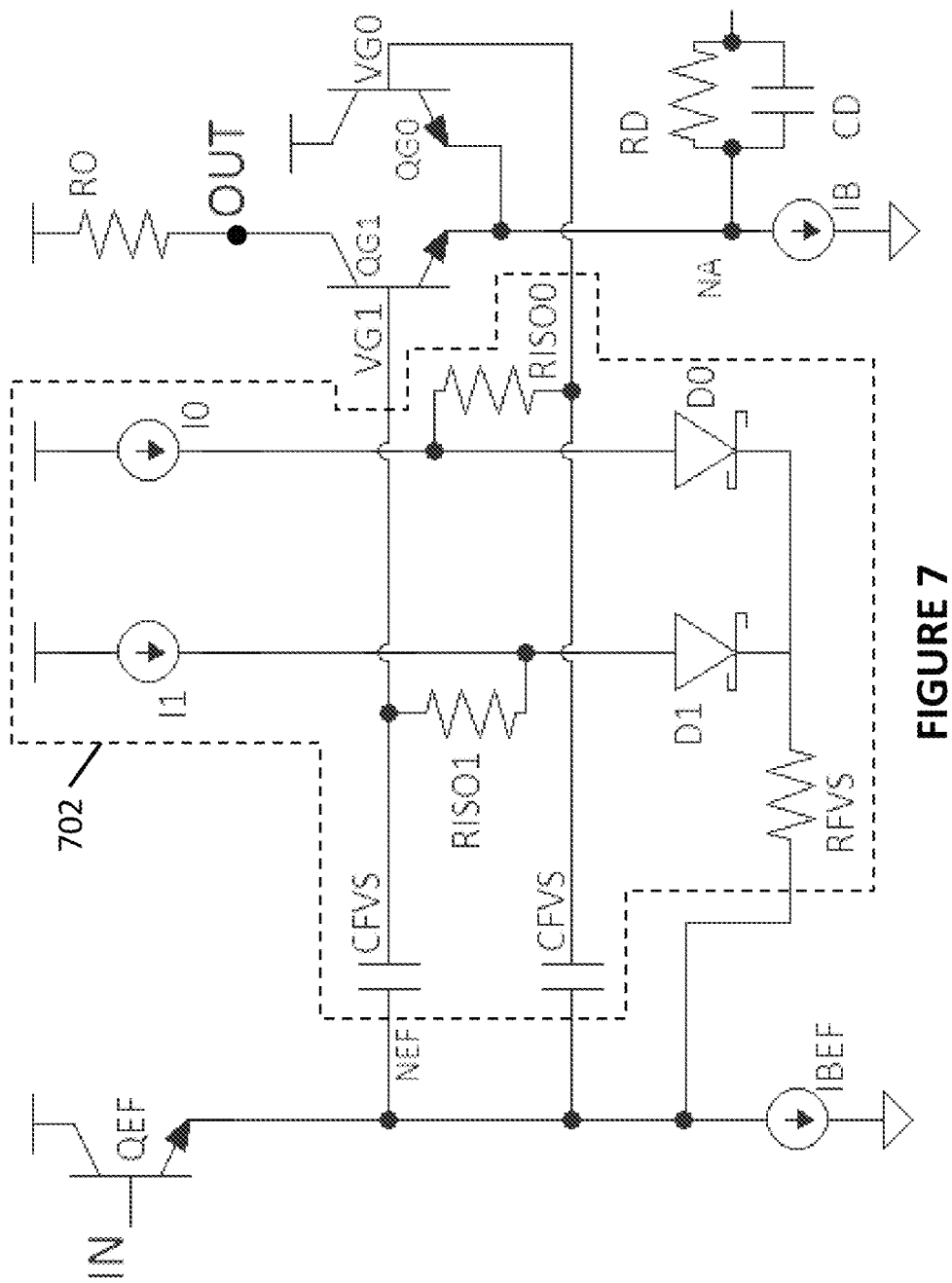
FIG. 7 shows yet another exemplary implementation of floating voltage sources, according to some embodiments of the disclosure.

FIG. 7 shows yet another exemplary implementation of floating voltage sources, according to some embodiments of the disclosure. To linearize the gain control, it is possible to implement the floating voltage source as shown in FIG. 7. Although the shown topology operates properly with regular PN junction diodes, if available, it is possible to utilize Schottky diodes to take advantage of its low forward voltage drop for extra flexibility on setting the operating bias voltage of the transistors $Q_{G0}$, $Q_{G1}$. To fix the voltage drop from the input node IN to $N_{EF}$, it is possible to fix the bias current $I_{BEF}$ of $Q_{EF}$ or equivalently the sum of the programming current sources $I_1$ and $I_0$:

$$I_{TOT} = I_1 + I_0$$

$$I_{BEF} = I_{QEF} + I_{TOT}$$

The gain voltage, i.e. $V_G$, that is the voltage difference $V_{G0}$ and $V_{G1}$ can be expressed as follows:

$$V_G = V_T \ln\left(\frac{I_0}{I_1}\right)$$

Substituting the above into the equation for K outlined previously:

$$K = \frac{I_1}{I_{TOT}}$$

Based on the above equation for the gain factor K, it is possible to control the gain linearly with the bias current $I_1$. Since, the sum of $I_1$ and $I_0$ is equal to $I_{TOT}$ and they have to be positive signed in order to keep the diode forward biased, the gain K is bounded within the interval (0-1). The DC operating voltage levels of the transistor $Q_{G0}$, $Q_{G1}$ can be properly set using $R_{FV}$ and $I_{TOT}$. The resistors $R_{ISO}$ are utilized to isolate the parasitic capacitance on the anode terminals of the diodes from the high frequency signal path. These resistors should be chosen low enough so that the gain set error created by the voltage drop across $R_{ISO}$ due to the base current of $Q_{G0}$, $Q_{G1}$ is within acceptable level. It is possible to include isolation resistors to the topologies seen in FIGS. 5-6. The sum of $R_{FVS}$ and $R_{ISO}$ can be chosen small enough compared to the $r_\pi$ input resistance of the $Q_{G0}$, $Q_{G1}$ transistors so that the DC gain attenuation due to the resistor divider is within acceptable range. Note that the value of the forward biased diode capacitance is function of its bias current. Hence, the diode capacitance changes with the gain setting. The adverse effect of the changing diode capacitance on the group delay of the signal path can be de-emphasized by properly selecting $R_{FVS}$ resistor value.

Programmable Current Sources

Figure 8:
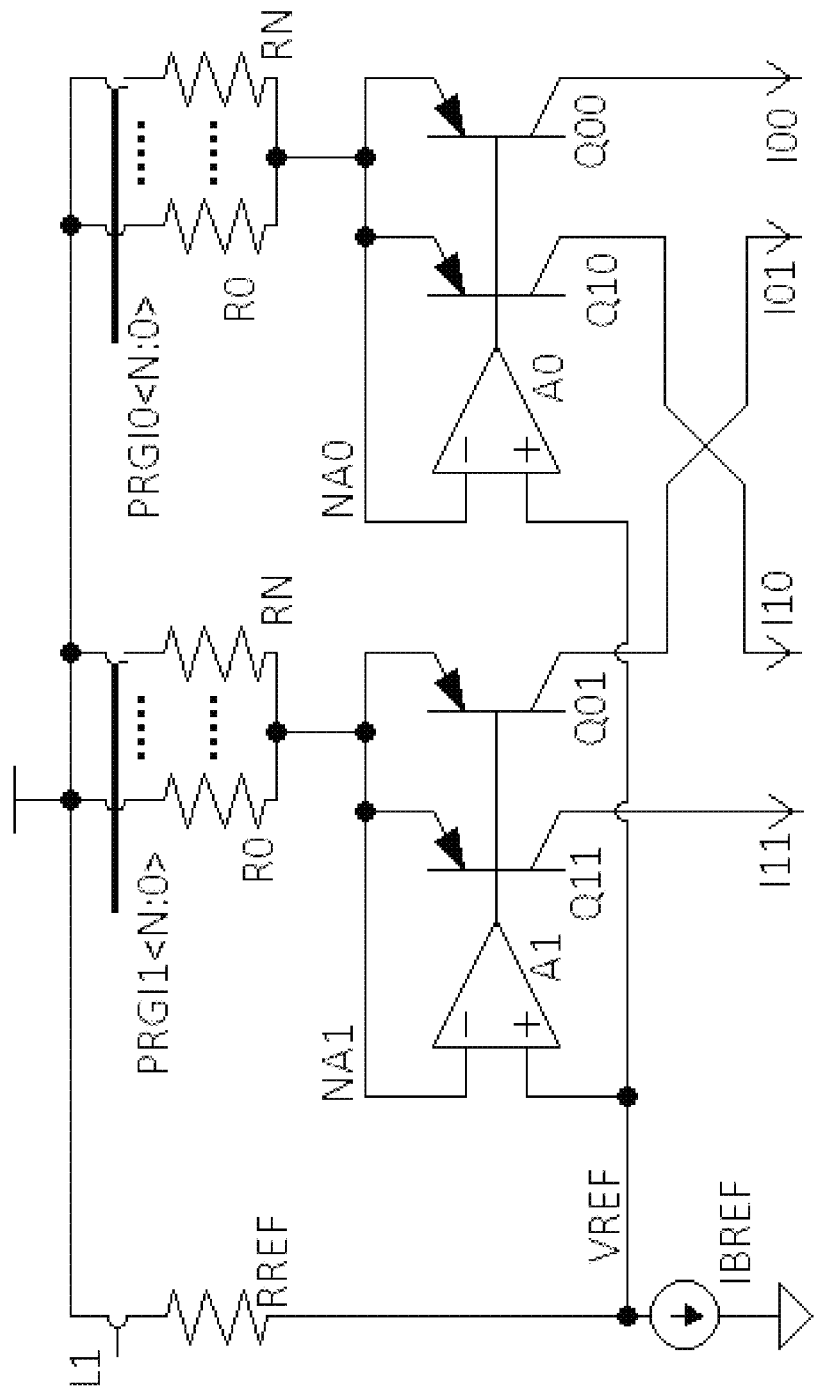
FIG. 8 shows exemplary programmable current sources for the floating voltage sources, according to some embodiments of the disclosure.

FIG. 8 shows exemplary programmable current sources $I_1$ and $I_0$ for the floating voltage sources, according to some embodiments of the disclosure. The reference current $I_{BREF}$ together with the reference resistor $R_{REF}$ generates a voltage $V_{REF}$. This voltage is regenerated on nodes $N_{A1}$ and $N_{A0}$ using the feedback loops formed by amplifier $A_1$, transistor $Q_{11}$, transistor $Q_{01}$, bank of switchable resistors in parallel $R_0$-$R_N$ and amplifier $A_0$, transistor $Q_{10}$, transistor $Q_{00}$, bank of switchable resistors in parallel $R_0$-$R_N$, respectively. The reference voltage on $N_{A0}$ and $N_{A1}$ are converted to current by the equivalent resistance to the supply terminal determined by PRGI0[N:0] and PRGI1[N:0]. The generated currents are then divided by 2 by $Q_{11}$-$Q_{01}$ and $Q_{10}$-$Q_{00}$ transistor pairs to feed the $I_1$ and $I_0$ currents of both positive and negative signal paths.

The positive and negative half current generators share the same amplifier so that the signal swing at the collector can be re-circulated to ease the amplifier design. The utilized amplifier ($A_0$ and $A_1$) can be a folded-cascode high gain amplifier having an NMOS input pair. The unity gain bandwidth frequency can be chosen low in order to reduce the noise introduced. This in turn benefit the power consumption requirement of the amplifier.

The output current can be expressed as follows:

$$I_{x1} = \frac{1}{2} \frac{R_{REF}}{R_{EQ1}} I_{BREF}$$

$$I_{x0} = \frac{1}{2} \frac{R_{REF}}{R_{EQ0}} I_{BREF}$$

The index x is either 0 or 1 denoting the current source connected to the base of the transistor $Q_{G0}$ or $Q_{G1}$, respectively. $R_{EQ0}$ and $R_{EQ1}$ are the equivalent resistance determined by the programming signals PRGI0[N:0] and PRGI1[N:0].

Variations and Implementations

Generally speaking, the low-voltage low-power variable gain amplifier disclosed herein can provide signal-conditioning with electronically settable voltage gain. Variable gain amplifiers are used in a variety of remote sensing and communications equipment. Applications ranging from cellular infrastructure, cellphones, ultrasound, radar, lidar, optical communications, wireless communications, and speech analysis have utilized variable gain in to enhance dynamic performance. VGAs can tame signals that exhibit wide dynamic range. For example, input signals to wireless receives can range from microvolts to volts. VGAs can be found in communications, cable TV, medical equipment, and industrial applications.

In the discussions of the embodiments above, the capacitors, resistors, amplifiers, diodes, transistors, and/or other components can readily be replaced, substituted, or otherwise modified in order to accommodate particular circuitry needs. Moreover, it should be noted that the use of complementary electronic devices (e.g., PNP bipolar transistor versus NPN bipolar transistor) offer an equally viable option for implementing the teachings of the present disclosure. Varied implementations are equivalent to the disclosed implementations using complementary transistors devices because the varied implementations would perform substantially the same function in substantially the same way to yield substantially the same result. Complementary or equivalent configurations would be considered interchangeable with embodiments described herein to a person with ordinary skill in the art.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of transistors, resistors, capacitors, diodes, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to the variable gain amplifier, illustrate only some of the possible functions that may be executed by, or within, systems illustrated in the FIGURES such as FIG. 4. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion.

Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features described herein may also be implemented with respect to the method or process described herein and specifics in the examples may be used anywhere in one or more embodiments.

What is claimed is:

1. A low-voltage low-power variable gain amplifier, the amplifier comprising:
   first differential voltage nodes following differential input voltages at differential input nodes based on a first fixed voltage change;
   first current branches driving differential output nodes;
   second current branches paired with respective first current branches to divide, according to a coefficient, a bias current and a difference current representative of the differential input voltages;
   first floating voltage sources, each one of the first floating voltage sources coupled between respective one of the first differential voltage nodes and respective one of first current branches to provide a first predetermined voltage change; and
   second floating voltage sources, each one of the second floating voltage sources coupled between respective one of the first differential voltage nodes and respective one of second current branches to provide a second predetermined change in the same direction as the first predetermined voltage change;
   wherein the first predetermined voltage change and the second predetermined voltage change correspond to the first fixed voltage change in magnitude but in an opposite direction and a difference between the first predetermined voltage change and the second predetermined voltage change sets the coefficient to provide variable gain of the amplifier.

2. The amplifier of claim 1, wherein:
   the first current branches and the second current branches comprises bipolar transistor devices; and
   the amplifier operates properly with a supply voltage as low as 1.5 Volts.

3. The amplifier of claim 1, wherein the amplifier has a minimum supply voltage requirement comprising one base-emitter voltage, compliance voltage of a current source generating the bias current, half of peak-to-peak voltage at the differential input nodes, and half of peak-to-peak voltage at the differential output nodes.

4. The amplifier of claim 1, wherein:
   the first differential voltage nodes are emitter nodes of emitter followers following respective differential input voltages; and
   the first fixed voltage change is one base-emitter voltage.

5. The amplifier of claim 4, wherein:
   the first predetermined voltage change and the second predetermined voltage change are set to substantially offset the one base-emitter voltage in the opposite direction.

6. The amplifier of claim 1, wherein:
   the coefficient controls an amount of the bias current and the difference current representative of the differential input voltages flowing through the first current branches and a remaining amount of the bias current and the difference current representative of the differential input voltages flowing through the second current branches to achieve the variable gain of the amplifier.

7. The amplifier of claim 1, wherein:
   each one of the first current branches comprises a bipolar transistor whose base is driven by a respective first floating voltage source; and
   each one of the second current branches comprises a bipolar transistor whose base is driven by a respective second floating voltage source.

8. The amplifier of claim 1, further comprising:
a first node at the emitters of transistors in a first one of the first current branches and a first one of the second current branches;
a second node at the emitters of transistors in a second one of the first current branches and a second one of the second current branches; and
a resistance between the first node and the second node;
wherein voltage difference of the differential input voltages is replicated at the first node and the second node through the first and second floating voltage sources and the first and second current branches, and the difference current is the voltage difference replicated at the first and second node divided by the resistance.

9. The amplifier of claim 1, further comprising:
second differential voltage nodes replicating a voltage difference of the differential input voltages through the first differential voltage nodes, the first and second floating voltage sources, and the first and second current branches;
wherein the difference current is generated by the replicated voltage difference across a resistance between the second differential voltage nodes.

10. The amplifier of claim 1, wherein:
the difference current is generated by a replicated voltage difference across a resistance; and
the replicated voltage difference is based on (1) a first one of the differential input voltage shifted by a fixed amount comprising the first predetermined voltage change and the second predetermined voltage change, and (2) a second one of the differential input voltage shifted by the same fixed amount.

11. The amplifier of claim 1, wherein:
the difference current is independent from the difference between the first predetermined voltage change and the second predetermined voltage change.

12. The amplifier of claim 1, wherein:
the difference between the first predetermined voltage change and the second predetermined voltage change is on the order of a hundred millivolts.

13. A low-voltage low-power variable gain amplification method comprising:
driving a base of a first transistor with a first voltage following a first one of differential input pair shifted by a first predetermined voltage shift, wherein the first transistor is coupled to a first one of a differential output pair;
driving a base of a second transistor with the first voltage shifted by a second predetermined voltage shift;
driving a base of a third transistor with a second voltage following a second one of a differential input pair shifted by the first predetermined voltage shift, wherein the third transistor is coupled to a second one of a differential output pair;
driving a base of a fourth transistor with the second voltage shifted by the second predetermined voltage shift;
generating a difference current based on a voltage difference of the differential input pair; and
dividing, between the first transistor and the second transistor and between the third transistor and the fourth transistor, a bias current and the difference current based on a difference between the first predetermined voltage shift and the second predetermined voltage shift.

14. The method of claim 13, wherein:
the difference between the first predetermined voltage shift and the second predetermined voltage shift corresponds to a gain coefficient of a variable gain amplifier.

15. The method of claim 13, wherein:
generating the difference current comprises generating the difference current independent from the difference between the first predetermined voltage shift and the second predetermined voltage shift.

16. The method of claim 13, further comprising:
replicating the voltage difference of the differential input pair using a same set of voltage shifts for both (1) a first path from the first one of the differential input pair to emitters of the first transistor and the second transistor, and (2) a second path from the second one of the differential input pair to emitters of the third transistor and the fourth transistor.

17. The method of claim 16, wherein the same set of voltage shifts comprises the first predetermined voltage shift, and the second predetermined voltage shift.

18. The method of claim 13, wherein:
the first predetermined voltage shift and the second predetermined voltage shift are in an opposite direction of a voltage shift from the first one of the differential pair to the first voltage.

19. The method of claim 13, further comprising:
converting collector currents of the first transistor and the third transistor to voltages at the differential output pair using output resistors.

20. A low-voltage low-power variable gain amplifier comprising:
a first input buffer following a first one of differential inputs;
a second input buffer following a second one of the differential inputs;
an output stage replicating a voltage difference of the differential inputs and converting the replicated voltage difference to a difference current independent of a gain setting;
a first gain setting stage controlling the output stage comprising a first floating voltage source and a second floating voltage source for shifting an output of the first input buffer by a first predetermined voltage change and a second predetermined voltage change respectively; and
a second gain setting stage controlling the output stage comprising a third floating voltage source and a fourth floating voltage source for shifting an output of the second input buffer by the first predetermined voltage change and the second predetermined voltage change respectively;
wherein a difference between the first predetermined voltage change and the second predetermined voltage change sets the gain setting being applied to a bias current and the difference current to provide a variable gain of the amplifier.

21. The low-voltage low-power variable gain amplifier of claim 20, wherein the first predetermined voltage change and the second predetermined voltage change are set to substantially offset, in the opposite direction, a base-emitter voltage change in the first input buffer and in the second input buffer.

22. The low-voltage low-power variable gain amplifier of claim 20, wherein:
the replicated voltage difference is based on (1) the first one of the differential inputs shifted by a fixed amount comprising the first predetermined voltage change and the second predetermined voltage change, and (2) the second one of the differential inputs shifted by the same fixed amount.

23. The low-voltage low-power variable gain amplifier of claim 20, wherein the difference current is generated by the replicated voltage difference across a resistance between differential voltage nodes having the replicated voltage difference.

\* \* \* \* \*